(12) United States Patent
Kikuta (10) Patent No.: US 9,553,603 B2
(45) Date of Patent: Jan. 24, 2017

(54) R-2R LADDER RESISTOR CIRCUIT, LADDER RESISTOR TYPE D/A CONVERSION CIRCUIT, AND SEMICONDUCTOR DEVICE

(71) Applicant: LAPIS SEMICONDUCTOR CO., LTD., Kanagawa (JP)

(72) Inventor: Hiroyuki Kikuta, Kanagawa (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 0 days.

(21) Appl. No.: 15/081,162

(22) Filed: Mar. 25, 2016

(65) Prior Publication Data

US 2016/0294407 A1 Oct. 6, 2016

(30) Foreign Application Priority Data

Mar. 30, 2015 (JP) .................................. 2015-068566

(51) Int. Cl.
*H03M 1/78* (2006.01)

(52) U.S. Cl.
CPC .................................. *H03M 1/785* (2013.01)

(58) Field of Classification Search
CPC ............................... H03M 1/78; H03M 1/785
USPC ........................................ 341/154; 333/81 R
See application file for complete search history.

(56) References Cited

U.S. PATENT DOCUMENTS

| 4,381,499 | A | * | 4/1983 | Struthoff | ................. | H03M 1/00 |
| | | | | | | 341/154 |
| 5,119,095 | A | * | 6/1992 | Asazawa | ............... | H03M 1/785 |
| | | | | | | 341/154 |
| 5,969,658 | A | * | 10/1999 | Naylor | .................... | H03M 1/68 |
| | | | | | | 341/154 |
| 7,336,211 | B1 | * | 2/2008 | Lai | .......................... | H03M 1/06 |
| | | | | | | 341/154 |

FOREIGN PATENT DOCUMENTS

| JP | 59-181821 A | | 10/1984 |
| JP | 01042924 A | * | 2/1989 |
| JP | 02202226 A | * | 8/1990 |

(Continued)

OTHER PUBLICATIONS

Kester, Basic DAC Architectures II: Binary DACs, Analog Devices Inc. MT-015 Tutorial, Revision A Oct. 2008.*

*Primary Examiner* — Howard Williams
(74) *Attorney, Agent, or Firm* — Volentine & Whitt, PLLC (57) ABSTRACT

An R-2R ladder resistor circuit including: plural first resistance elements, one end of each being connected to an input terminal; plural second resistance elements, one end of each being connected to a reference potential; plural third resistance elements, one end of each being connected to an output terminal; and plural switching connection sections that are each in correspondence relationships with the first resistance elements, the second resistance elements, and the third resistance elements, and that connect the input terminal and the output terminal according to a bit signal, wherein, (Continued)

according to the bit signal, each switching connection section switchably connects another end of the third resistance element to another end of the first resistance element or to another end of the second resistance element, among the first resistance element, the second resistance element, and the third resistance element corresponding thereto.

13 Claims, 4 Drawing Sheets

(56) References Cited

FOREIGN PATENT DOCUMENTS

| JP | H05-268094 A | 10/1993 | |
|---|---|---|---|
| JP | 05327510 A * | 12/1993 | |
| WO | WO 9016114 A1 * | 12/1990 | .......... H03M 1/0678 |

\* cited by examiner

RELATED ART

R-2R LADDER RESISTOR CIRCUIT, LADDER RESISTOR TYPE D/A CONVERSION CIRCUIT, AND SEMICONDUCTOR DEVICE

CROSS REFERENCE TO RELATED APPLICATION

This application claims priority under 35 USC 119 from Japanese Patent Application No. 2015-068566, filed on Mar. 30, 2015, the disclosure of which is incorporated by reference herein.

BACKGROUND

Technical Field

The present disclosure relates to an R-2R ladder resistor circuit, a ladder resistor type D/A conversion circuit, and a semiconductor device.

Related Art

A digital/analog (D/A) conversion circuit, provided with an R-2R ladder resistor circuit, has been widely known. The R-2R ladder resistor circuit is a circuit in which a resistance element with a resistance value R and a resistance element with a resistance value 2R are connected in a ladder shape (for example, see Japanese Patent Application Laid-Open (JP-A) No. S59-181821).

Figure 4:
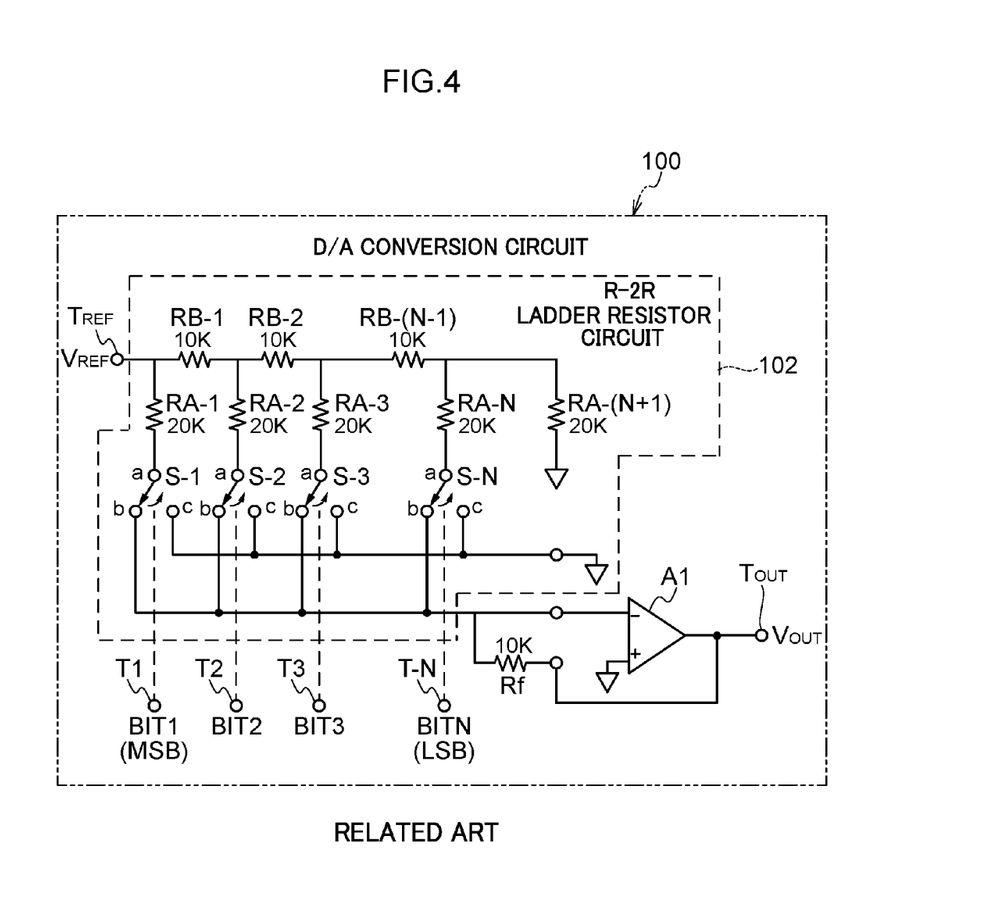
FIG. 4 is a schematic circuit diagram illustrating a circuit configuration of a conventional D/A conversion circuit.

FIG. 4 illustrates an example of a conventional D/A conversion circuit 100. As illustrated in FIG. 4, the D/A conversion circuit 100 is a ladder resistor type D/A conversion circuit including an R-2R ladder resistor circuit 102, and is provided with a reference potential input terminal $T_{REF}$, bit signal input terminals T-1 to T-N, an operational amplifier A1, and an output terminal $T_{out}$.

The reference potential input terminal $T_{REF}$ is connected to a reference potential $V_{REF}$. Respective bits BIT-1(MSB) to BIT-N(LSB) of a digital signal, which is defined by an N-bit, are input to the bit signal input terminals T-1 to T-N. Here, the MSB indicates the most significant bit, and the LSB indicates the least significant bit.

Resistance elements RB-1 to RB-N−1) and RA-(N+1) are connected in series in the R-2R ladder resistor circuit 102, the resistance element RB-1 is connected to the reference potential input terminal $T_{REF}$, and the resistance element RA-(N+1) is connected to a ground potential. Each end of resistance elements RA-1 to RA-N is connected to each connection point among the resistance elements RB-1 to RB-(N−1) and RA-(N+1) connected in series, and each other end of the resistance elements RA-1 to RA-N is connected to each movable contact a of switches S-1 to S-N corresponding thereto. Each fixed contact b of the switches S-1 to S-N is connected commonly to an inverting input terminal of the operational amplifier A1, and the other fixed contacts c are connected to the ground potential. Further, an output terminal of the operational amplifier A1 is connected to the inverting input terminal of the operational amplifier A1 via a feedback resistance element Rf.

Here, each resistance value of the resistance elements RA-1 to RA-(N+1) is set to 20 kΩ, and each resistance value of the resistance elements RB-1 to RB-(N−1) and Rf is set to 10 kΩ.

However, in the R-2R ladder resistor circuit 102, the fixed contact b is directly connected to the operational amplifier A1, and thus, a feed through noise, generated in the switches S-1 to S-N in a case in which the switches S-1 to S-N operate, may degrad an output characteristic of the D/A conversion circuit 100. In addition, in a case in which the ground potential is changed to a reference potential as another potential, the reference potential is influenced by the feedthrough noise, since the fixed contact c is also directly connected to the ground potential, and as a result, the output characteristic of the D/A conversion circuit 100 may be degraded. In addition, in a case in which the reference potential is shared with another circuits different from the D/A conversion circuit 100, the other circuits, which commonly uses the reference potential, may also be influenced by the feedthrough noise.

SUMMARY

The present disclosure is to provide an R-2R ladder resistor circuit, a ladder resistor type D/A conversion circuit, and a semiconductor device that may reduce influence of feedthrough noise to a circuit characteristic.

A first aspect of the present disclosure is an R-2R ladder resistor circuit, including: plural first resistance elements, one end of each being connected to an input terminal; plural second resistance elements, one end of each being connected to a reference potential; plural third resistance elements, one end of each being connected to an output terminal; and plural switching connection sections that are each in correspondence relationships with the first resistance elements, the second resistance elements, and the resistance elements, and that connect the input terminal and the output terminal according to a bit signal, wherein, according to the bit signal, each switching connection section switchably connects another end of the third resistance element to another end of the first resistance element or to another end of the second resistance element, among the first resistance element, the second resistance element, and the third resistance element corresponding thereto.

A second aspect of the present disclosure is An R-2R ladder resistor circuit, including: plural first resistance elements, one end of each being connected to an input terminal; plural second resistance elements, one end of each being connected to a reference potential that is different from a ground potential; plural third resistance elements, one end of each being connected to an output terminal; and plural switching connection sections that are each in correspondence relationships with the first resistance elements, the second resistance elements, and the third resistance elements, wherein, according to a bit signal, each switching connection section switchably connects another end of the third resistance element to another end of the first resistance element or to another end of the second resistance element, among the first resistance element, the second resistance element, and the third resistance element corresponding thereto.

A third aspect of the present disclosure is a ladder resistor type D/A conversion circuit, including: the R-2R ladder resistor circuit according to the above aspects; and an operational amplifier to which the output terminal included in the R-2R ladder resistor circuit is connected.

A fourth aspect of the present disclosure is a semiconductor device, including: the ladder resistor type D/A conversion circuit according to the third aspect; and a reference potential generation circuit that generates a reference potential and includes a supply terminal that supplies the generated reference potential to plural circuits, including the ladder resistor type D/A conversion circuit, that require the reference potential.

A fifth aspect of the present disclosure is an R-2R ladder resistor circuit, including: plural first resistance elements, one end of each being connected to an input terminal; plural resistance elements, one end of each being connected to a reference potential; plural third resistance elements, one end of each being connected to an output terminal; and plural switching connection sections, wherein each switching connection section switchably connects another end of the corresponding third resistance element to another end of the corresponding first resistance element or to another end of the corresponding second resistance element, according a bit signal, and wherein each connection path connecting the input terminal and the output terminal includes the first resistance element and the third resistance element, and each connection path connecting the reference potential and the output terminal includes the second resistance element and the third resistance element.

A sixth aspect of the present disclosure is an R-2R ladder resistor circuit, including: plural first resistance elements, one end of each being connected to an input terminal; plural second resistance elements, one end of each being connected to a reference potential different from a ground potential; plural third resistance elements, one end of each being connected to an output terminal; and plural switching connection sections, wherein each switching connection section switchably connects another end of the corresponding third resistance element to another end of the corresponding first resistance element or to another end of the corresponding second resistance element, according a bit signal.

According to the above aspects, the present disclosure may reducing influence of feedthrough noise to the circuit characteristic.

BRIEF DESCRIPTION OF THE DRAWINGS

Exemplary embodiments will be described in detail based on the following figures, wherein.

DETAILED DESCRIPTION

Hereinafter, exemplary embodiments of the present disclosure will be described in detail with reference to the drawings.

First Exemplary Embodiment

Figure 1:
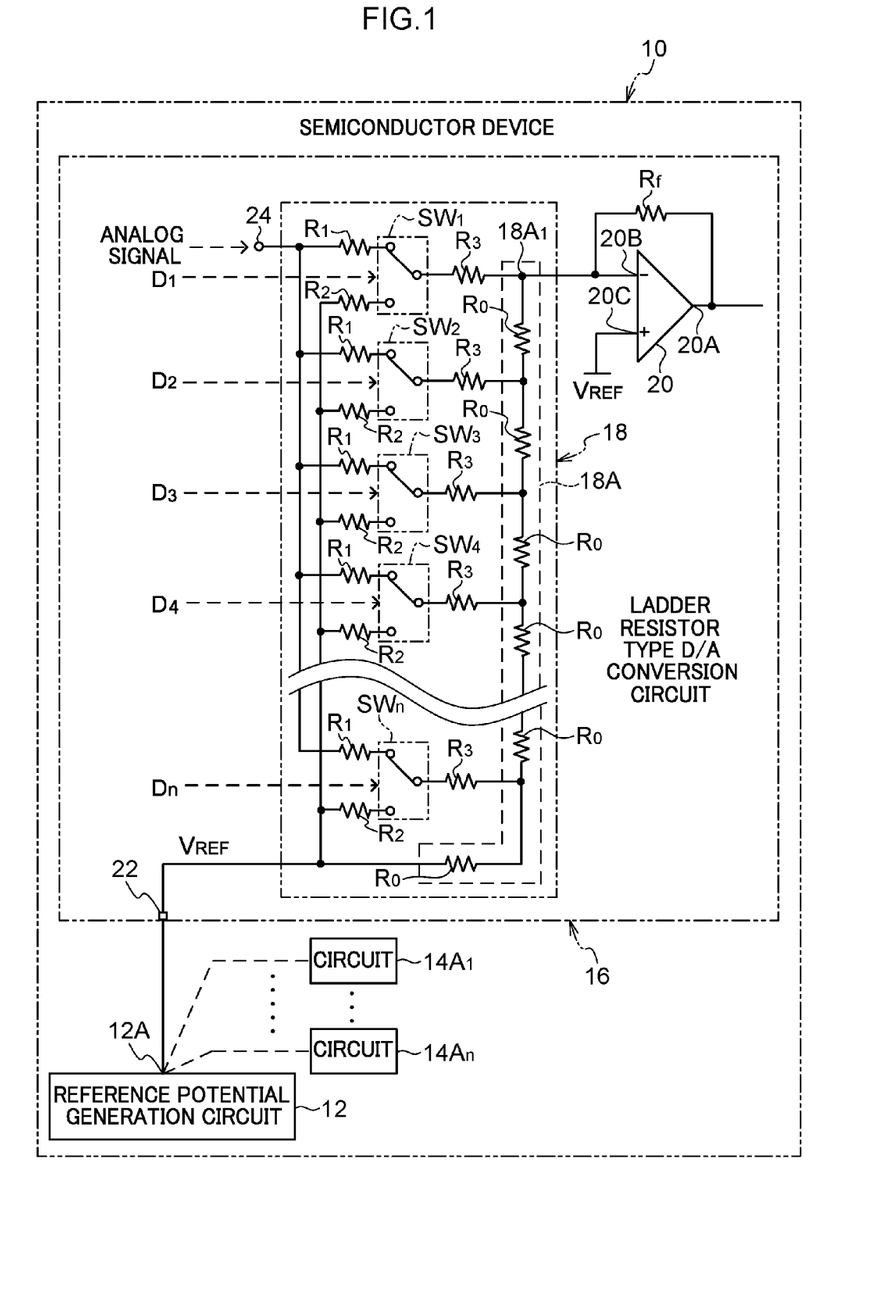
FIG. 1 is a schematic configuration diagram illustrating a main configuration of a semiconductor device according to a first exemplary embodiment.

For example, a semiconductor device 10 includes a reference potential generation circuit 12, circuits $14A_1$ to $14A_n$, and a ladder resistor type D/A conversion circuit 16 as illustrated in FIG. 1.

The reference potential generation circuit 12 generates a reference potential $V_{REF}$ which is required in the circuits $14A_1$ to $14A_n$ and the ladder resistor type D/A conversion circuit 16. Note that the reference potential $V_{REF}$ is an example of a reference potential according to the present disclosure.

The reference potential $V_{REF}$ is a potential different from a ground potential. Although a potential having a sine wave is employed as an example of the reference potential $V_{REF}$ in the first exemplary embodiment, the present disclosure it not limited thereto, and may employ a potential which fluctuates with a waveform other than the sine wave, or may employ a potential which is fixed and higher than the ground potential.

The reference potential generation circuit 12 is provided with a supply terminal 12A. The circuits $14A_1$ to $14A_n$ and the ladder resistor type D/A conversion circuit 16 are connected to the supply terminal 12A. The reference potential generation circuit 12 supplies the generated reference potential $V_{REF}$ from the supply terminal 12A to the circuits $14A_1$ to $14A_n$ and the ladder resistor type D/A conversion circuit 16.

The ladder resistor type D/A conversion circuit 16 is a multiplying D/A conversion circuit, and includes an R-2R ladder resistor circuit 18, an operational amplifier 20, a reception and supply terminal 22, and an input terminal 24.

An analog signal is input to the input terminal 24. Here, the analog signal is an analog signal that represents a physical quantity detected by a sensor, for example.

An output terminal 20A of the operational amplifier 20 is connected to an inverting input terminal 20B of the operational amplifier 20 via the feedback resistance element $R_f$. A non-inverting input terminal 20C of the operational amplifier 20 is connected to the supply terminal 12A, and the reference potential $V_{REF}$ is supplied to the non-inverting input terminal 20C.

The R-2R ladder resistor circuit 18 is provided with single pole double throw type switches $SW_1$ to $SW_n$, each of which is an example of a switching connection section according to the present disclosure. Here, the switch $SW_1$ is a switch which corresponds to the MSB, the switch $SW_n$ is a switch which corresponds to the LSB. Hereinafter, the switches $SW_1$ to $SW_n$ will be referred to as a "switch SW" in a case in which it is unnecessary to give a description with distinction for convenience of description.

The number of the switches SW is a number corresponding to the number of bits, and the n switches SW corresponding to the N-bit are illustrated as an example in FIG. 1. A bit signal D, which is a one-bit digital signal, is input to the respective switches SW, and the switch SW operates according to the input bit signal. The switch $SW_1$ operates according to an input bit signal $D_1$ in the example illustrated in FIG. 1. In addition, the switch $SW_2$ operates according to an input bit signal $D_2$. In addition, the switch $SW_3$ operates according to an input bit signal $D_3$. In addition, the switch $SW_4$ operates according to an input bit signal $D_4$. Further, the switch $SW_n$ operates according to an input bit signal $D_n$.

The plural resistance elements R are connected in a ladder shape. The resistance element R is categorized into resistance elements $R_0$, resistance elements $R_1$, which is an example of first resistance elements according to the present disclosure, resistance elements $R_2$, which is an example of second resistance elements according to the present disclosure, and resistance elements $R_3$ which is an example of third resistance elements according to the present disclosure.

Each of the resistance elements $R_0$, the resistance elements $R_1$, the resistance element $R_2$, and the resistance elements $R_3$ are allocated to each one of the entire switch SW.

The R-2R ladder resistor circuit 18 includes a series circuit 18A. The series circuit 18A is a circuit to which the resistance elements $R_0$ provided in correspondence to each of the switch SW are connected in series. One terminal $18A_1$ of the series circuit 18A is connected to the inverting input terminal 20B, and the other end of the series circuit 18A is connected to the reception and supply terminal 22.

Plural connection paths to connect the input terminal 24 and the one terminal $18A_1$ are provided in the R-2R ladder resistor, circuit 18. Further, the resistance element $R_1$ and the resistance element $R_3$ are provided in each connection path that connects the input terminal 24 and the one terminal $18A_1$.

Plural connection paths to connect the reception and supply terminal 22 and the one terminal $18A_1$ are provided in the R-2R ladder resistor circuit 18. Further, the resistance element $R_2$ and the resistance element $R_3$ are provided in each connection path that connects the reception and supply terminal 22 and the one terminal $18A_1$.

Respective one-side ends of the resistance elements $R_3$ are connected via the one resistance element $R_0$ in the series circuit 18A. Namely, one end of one resistance element $R_3$ is connected to the one terminal $18A_1$ of the series circuit 18A, and the on ends of the other resistance elements $R_3$ are connected, one by one, to the respective connection points of the resistance elements $R_0$ in the series circuit 18A.

Each one end of the resistance elements $R_1$ is connected to the input terminal 24, and each one end of the resistance element $R_2$ is connected to the reception and supply terminal 22.

According to the bit signal D, each switch SW switchably connects the other end of the resistance element $R_3$ to the other end of the resistance element $R_1$ or to the other end of the resistance element among the corresponding resistance element $R_1$, resistance element $R_2$, and resistance element $R_3$. Namely, the switch SW allows the other end of the resistance element $R_3$ to be connected to either the other end of the resistance element $R_1$ or the other end of the resistance element $R_2$.

Note that each set of resistance elements including one resistance element $R_0$, one resistance element $R_1$, one resistance element $R_2$, and one resistance element $R_3$, is allocated to one switch SW for each of the plural switches SW, and the switch SW connects the input terminal 24 and the output terminal 20A depending on the bit signal D. Here, the entire switch SW indicates the switches $SW_1$ to $SW_n$ illustrated in FIG. 1, for example.

In addition, each resistance value of the resistance element $R_0$, the resistance element $R_1$, the resistance element $R_2$, and the resistance element $R_3$ is set to 10 kΩ in the first exemplary embodiment. Thus, the resistance element $R_1$ and the resistance element $R_3$, connected via the switch SW, function as a 2R portion of the R-2R ladder resistor circuit 18, and the resistance element $R_2$ and the resistance element $R_3$, connected via the switch SW, function as the 2R portion of the R-2R ladder resistor circuit 18. In addition, the resistance element $R_0$ functions as R portion of the R-2R ladder resistor circuit 18.

Next, an operation of the semiconductor device 10 according to the first exemplary embodiment will be described.

Each of the switches SW allows the other end of the resistance element $R_3$ to be connected either the other end of the resistance element $R_1$ or the other end of the resistance element $R_2$ according to the corresponding bit signal D.

In a case in which the other end of the resistance element $R_3$ and the other end of the resistance element $R_1$ are connected via the switch SW, the analog signal is input to the resistance element $R_3$ via the resistance element $R_1$ and the switch SW. In a case in which the other end of the resistance element $R_3$ and the other end of the resistance element $R_2$ are connected via the switch SW, the reference potential $V_{REF}$ is input to the resistance element $R_3$ via the resistance element $R_2$ and the switch SW.

Accordingly, a potential difference between the analog signal and the reference potential $V_{REF}$ is adjusted by the R-2R ladder resistor circuit 18 and is input to the inverting input terminal 20B of the operational amplifier 20. Thus, a signal according to a potential difference, adjusted by the R-2R ladder resistor circuit 18, is output from the output terminal 20A.

Here, the feedthrough noise generated in the switch SW is attenuated by the resistance element $R_1$ in a case in which the switch SW operates according to the bit signal D and connects the other end of the resistance element $R_3$ and the other end of the resistance element $R_1$. Accordingly, the influence of the feedthrough noise to the analog signal may be reduced.

On the other hand, the feedthrough noise generated in the switch SW is attenuated by the resistance element $R_2$ in a case in which the switch SW operates according to the bit signal D and connects the other end of the resistance element $R_3$ and the other end of the resistance element $R_2$. Accordingly, the influence of the feedthrough noise to the reference potential $V_{REF}$ may be reduced.

In addition, in a case in which the influence of the feedthrough noise to the reference potential $V_{REF}$ is reduced in this manner, the influence of the feedthrough noise to the circuits $14A_1$ to $14A_n$, which shares the reference potential $V_{REF}$ with the ladder resistor type D/A conversion circuit 16, may also be reduced.

In addition, the feedthrough noise generated in the switch SW is also attenuated by the resistance element $R_3$. Accordingly, the influence of the feedthrough noise to the inverting input terminal 20B of the operational amplifier 20 may be reduced.

As described above, in the semiconductor device 10, the switches $SW_1$ to $SW_n$, included in the R-2R ladder resistor circuit 18 are all the switches that connect the input terminal 24 and the one terminal $18A_1$ of the series circuit 18A according to the bit signal D. In addition, the plural switches SW included in the R-2R ladder resistor circuit 18 have correspondence relationships with the plural resistance elements $R_1$, correspondence relationships with the plural resistance elements $R_2$, and correspondence relationships with the plural resistance elements $R_3$. Further, the other end of the resistance element $R_3$ is switchably connected to the resistance element $R_1$ or the resistance element $R_2$ by the switch SW, among the corresponding resistance element $R_1$, resistance element $R_2$, and resistance element $R_3$.

Accordingly, in the semiconductor device 10, the feedthrough noise is attenuated by the resistance element $R_1$, the resistance element $R_2$, and the resistance element $R_3$, and thus, the semiconductor device 10 of the present exemplary embodiment may reduce the influence of the feedthrough noise to characteristics of the ladder resistor type D/A conversion circuit 16.

In addition, in the semiconductor device 10, the resistance element $R_2$ included in the R-2R ladder resistor circuit 18 is connected to the reference potential $V_{REF}$. Therefore, the semiconductor device 10 of the present exemplary embodiment may reduce the influence of the feedthrough noise to the reference potential $V_{REF}$, which is one of the characteristics of the ladder resistor type D/A conversion circuit 16, since the feedthrough noise is attenuated by the resistance element $R_2$.

In addition, in the semiconductor device 10, the reception and supply terminal 22 is connected to the supply terminal 12A of the reference potential generation circuit 12 together with the circuits $14A_1$ to $14A_n$. Therefore, since the feedthrough noise is attenuated by the resistance element $R_2$, the semiconductor device 10 may reduce the influence of the feedthrough noise to the circuits $14A_1$ to $14A_n$.

In addition, the resistance element $R_1$ and the resistance element $R_3$, connected via the switch SW, function as the 2R portion of the R-2R ladder resistor circuit 18 in the semiconductor device 10. In addition, the resistance element $R_2$ and the resistance element $R_3$, connected via the switch SW, function as the 2R portion of the R-2R ladder resistor circuit 18. Therefore, the semiconductor device 10 may realize an R-2R the ladder resistor type D/A conversion and may reduce the influence of the feedthrough noise to the circuit characteristic of the ladder resistor type D/A conversion circuit 16.

Figure 2:
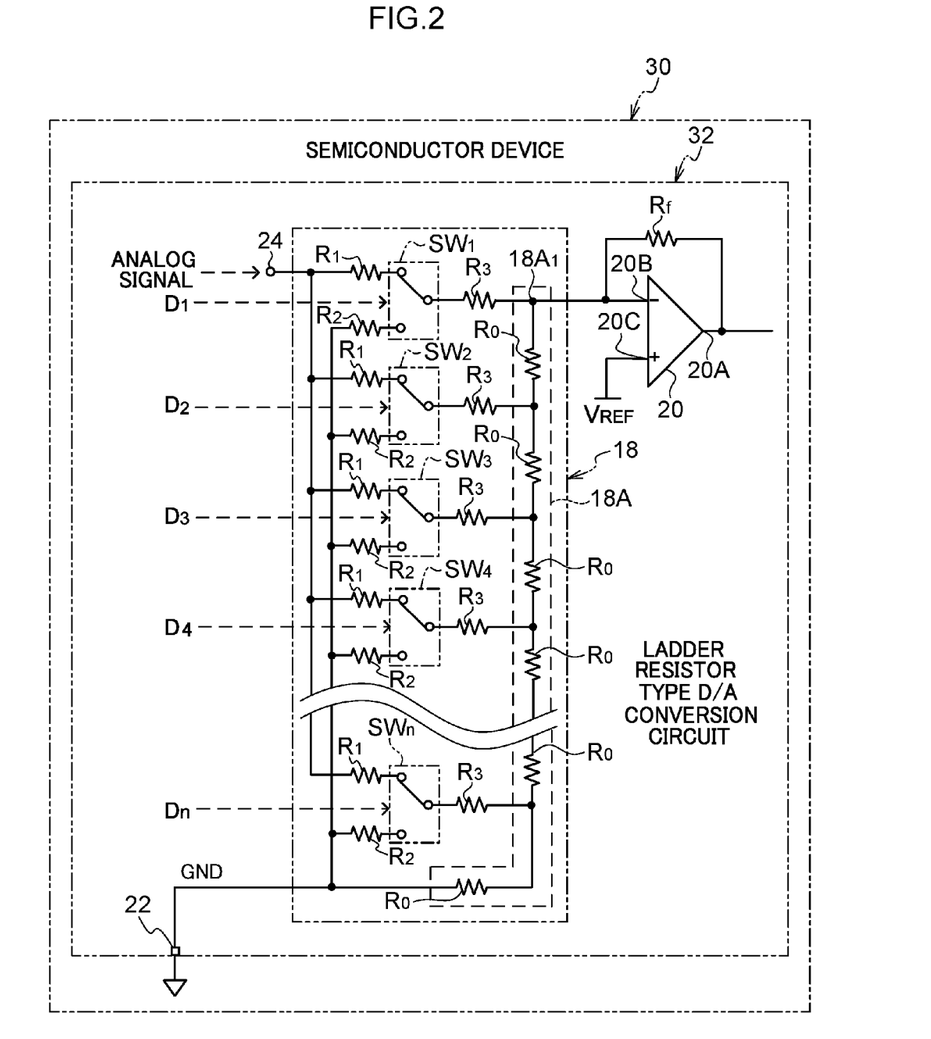
FIG. 2 is a schematic configuration diagram illustrating a modified example of the semiconductor device according to the first exemplary embodiment.

In the first exemplary embodiment, although a case in which the reception and supply terminal 22 of the semiconductor device 10 is connected to the reference potential $V_{REF}$ has been described, the present disclosure is not limited thereto, and may be a semiconductor device 30 as illustrated in FIG. 2, for example.

As illustrated in FIG. 2, for example, the semiconductor device 30 differs from the semiconductor device 10 in the point that a ladder resistor type D/A conversion circuit 32 is included instead of the ladder resistor type D/A conversion circuit 16. In addition, the ladder resistor type D/A conversion circuit 32 differs from the ladder resistor type D/A conversion circuit 16 in the points that the reception and supply terminal 22 is connected to the ground potential GND instead of the point that the reception, and supply terminal 22 is connected to the reference potential $V_{REF}$.

In the above case, a potential difference between the analog signal and the ground potential GND is adjusted by the R-2R ladder resistor circuit 18 and is input to the inverting input terminal 20B of the operational amplifier 20, and a signal according to a potential difference, adjusted by the R-2R ladder resistor circuit 18, is output from the output terminal 20A. Further, the feedthrough noise generated in the switch SW is attenuated by the resistance element $R_1$ in a case in which the switch SW operates according to the bit signal D and connects the other end of the resistance element $R_3$ and the other end of the resistance element $R_1$, as described in the first exemplary embodiment. In addition, the feedthrough noise generated in the switch SW is also attenuated by the resistance element $R_3$.

As a result, similarly to the first exemplary embodiment, the influence of the feedthrough noise to the characteristics of the ladder resistor type D/A conversion circuit 16 (for example, the influence on the inverting input terminal 20B) may be reduced.

Second Exemplary Embodiment

Although a case in which the feedthrough noise is attenuated by the resistance element $R_1$ and the resistance element $R_3$ has been described in the first exemplary embodiment, a description will be given in a second exemplary embodiment regarding a case in which the feedthrough noise is attenuated using a pair of complementary metal-oxide-semiconductor (CMOS) switches. Hereinafter, the same reference numerals will be given to elements that have been described in the first exemplary embodiment, and the description thereof will be omitted for convenience of description.

Figure 3:
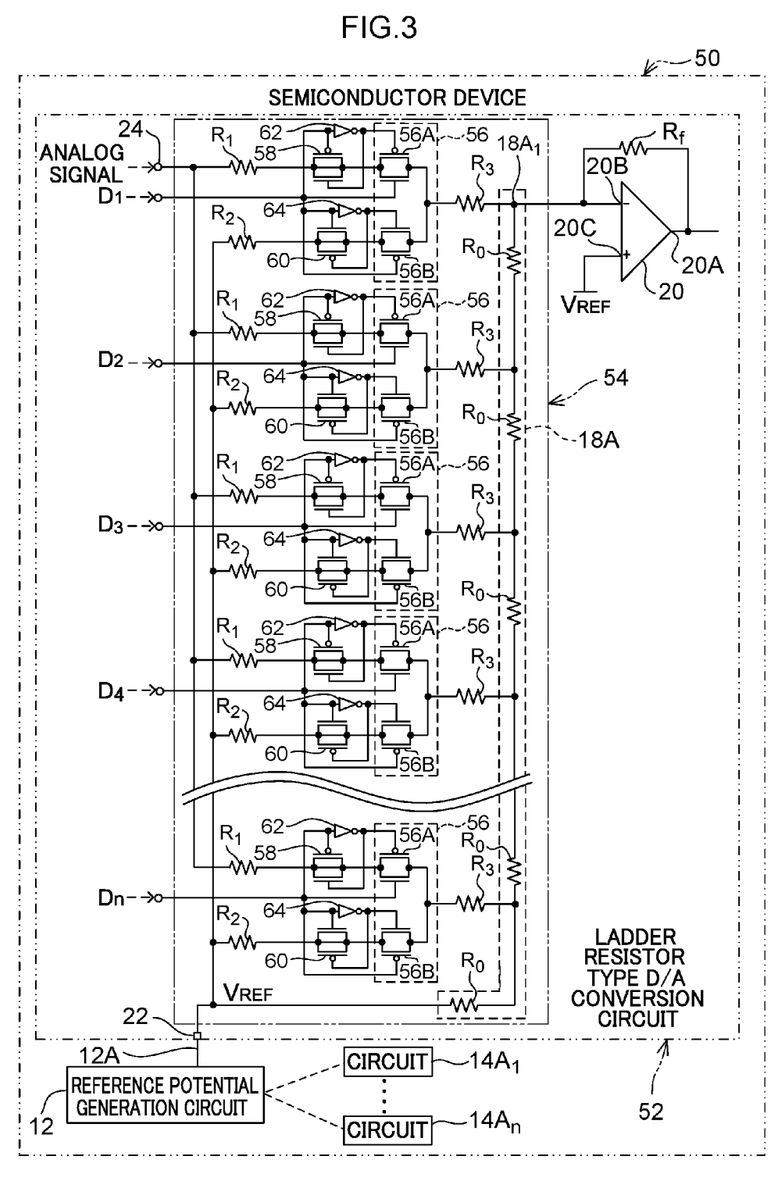
FIG. 3 is a schematic configuration diagram illustrating a main configuration of a semiconductor device according to a second exemplary embodiment.

As illustrated in FIG. 3, for example, a semiconductor device 50 according to the second exemplary embodiment differs from the semiconductor device 10 according to the first exemplary embodiment in the point that a ladder resistor type D/A conversion circuit 52 is included instead of the ladder resistor type D/A conversion circuit 16. The ladder resistor type D/A conversion circuit 52 differs from the ladder resistor type D/A conversion circuit 16 in the point that an R-2R ladder resistor circuit 54 is included instead of the R-2R ladder resistor circuit 18.

The ladder resistor circuit 54 differs from the R-2R ladder resistor circuit 18 in the point that a CMOS switch pair 56 is included instead of the switch SW. In addition, the ladder resistor circuit 54 differs from the R-2R ladder resistor circuit 18 in the points that dummy CMOS switches 58 and 60 are included, and inverting circuits 62 and 64 are included.

The CMOS switch pair 56, which is an example of the pair of CMOS switches according to the present disclosure, includes CMOS switches 56A and 56B having the same size with each other. Note that the term of the "same" used here means not only completely the "same", but also a concept which includes an error caused in a manufacturing process or the like.

One terminal of the CMOS switch 56A, which is an example of one CMOS switch according to the present disclosure, and one terminal of the CMOS switch 56B, which is an example of the other CMOS switch according to the present disclosure, are connected to the other end of the resistance element $R_3$.

A gate at a P-channel side of the CMOS switch 56A is connected to an output terminal of an inverting circuit 62, and a gate at an N-channel side of the CMOS switch 563 is connected to an output terminal of an inverting circuit 64.

The bit signal D is input to a gate at an N-channel side of the CMOS switch 56A, a gate at a P-channel side of the CMOS switch 56B, and each input terminal of the inverting circuits 62 and 64.

A size of the dummy CMOS switch 58, which is an example of a first CMOS switch according to the present disclosure, is half the size of the CMOS switch 56A. In addition, a size of the dummy CMOS switch 60, which is an example of a second CMOS switch according to the present disclosure, is half the size of the CMOS switch 563. Note that the term of "half" used here means not only completely "half", but also a concept which includes an error caused in the manufacturing process or the like.

Source and drain of the dummy CMOS switches 58 and 60 are short-circuited. The CMOS switch 56A is connected to the other end of the resistance element $R_1$ via the short-circuit path of the dummy CMOS switch 58. The CMOS switch 56B is connected to the other end of the resistance element $R_2$ via the short-circuit path of the dummy CMOS switch 60.

A gate at a P-channel side of the dummy CMOS switch 58 is connected to the input terminal of the inverting circuit 62, and a gate at an N-channel side of the dummy CMOS switch 58 is connected to the output terminal of the inverting circuit 62. In addition, again at an N-channel side of the dummy CMOS switch 60 is connected to the input terminal of the inverting circuit 64, and a gate at a P-channel side of the dummy CMOS switch 60 is connected to the output terminal of the inverting circuit 64.

Next, an operation of the semiconductor device 50 according to the second exemplary embodiment will be described.

In a case in which the bit signal D is input to the CMOS switch pair 56, the CMOS switches 56A and 56B perform switching operations, which are opposite to each other, according to the input bit signal. Here, the switching operations which are opposite to each other means that one of the CMOS switches 56A and 56B is turned ON, and the other one thereof is turned OFF.

Namely, the CMOS switch pair 56 switches between a first connection state and a second connection state according to the input bit signal. The first connection state is a connection state in which the other end of the resistance element $R_1$ and the other end of the resistance element $R_3$ are connected without connecting the other end of the resistance element $R_2$ and the other end of the resistance element $R_3$. The second connection state is a connection state in which the other end of the resistance element $R_2$ and the other end of the resistance element $R_3$ are connected without connecting the other end of the resistance element $R_1$ and the other end of the resistance element $R_3$.

The dummy CMOS switch 58 performs a switching operation which is opposite to the switching operation of the CMOS switch 56A. Namely, the dummy CMOS switch 58 is turned OFF in a case in which the CMOS switch 56A is turned ON in the first connection state, and the dummy CMOS switch 58 is turned ON in a case in which the CMOS switch 56A is turned OFF in the second connection state.

Accordingly, a feedthrough noise generated in the switching operation of the CMOS switch 56A is canceled by a feedthrough noise with an opposite polarity generated in the switching operation of the dummy CMOS switch 58. In addition, the feedthrough noise is attenuated also by the resistance element $R_1$ which is interposed between the input terminal 24 and the dummy CMOS switch 58. Accordingly, the ladder resistor type D/A conversion circuit 52 of the present exemplary embodiment may reduce the influence of the feedthrough noise, generated in the switching operation of the CMOS switch 56A, to the analog signal.

The dummy CMOS switch 60 performs a switching operation which is opposite to the switching operation of the CMOS switch 56B. Namely, the dummy CMOS switch 60 is turned ON in a case in which the CMOS switch 56B is turned OFF in the first connection state, and the dummy CMOS switch 60 is turned OFF in a case in which the CMOS switch 56B is turned ON in the second connection state.

Accordingly, a feedthrough noise generated in the switching operation of the CMOS switch 56B is canceled by a feedthrough noise with an opposite polarity generated in the switching operation of the dummy CMOS switch 60. In addition, the feedthrough noise is attenuated also by the resistance element $R_2$ which is interposed between the reception and supply terminal 22 and the dummy CMOS switch 60. Accordingly, the influence of the feedthrough noise, generated in the switching operation of the CMOS switch 56B, to the reference potential $V_{REF}$ may be reduced.

Further, the feedthrough noises generated in the respective CMOS switches 56A and 56B have the opposite-polarity relationship with each other, and thus, cancels each other on the other end side of the resistance element $R_3$. Further, the feedthrough noise is attenuated also by the resistance element $R_3$. Accordingly, the influence of the feedthrough noise, generated in the switching operations of the CMOS switches 56A and 569, to the inverting input terminal 20B of the operational amplifier 20 may be reduced.

As described above, the R-2R ladder resistor circuit 54 is provided with the CMOS switch pair 56 which switches the first connection state and the second connection state according the bit signal in the semiconductor device 50. Accordingly, the feedthrough noise generated in the CMOS switch pair 56 is attenuated by the resistance element $R_1$, the resistance element $R_2$, and the resistance element $R_3$. Thus, the ladder resistor type D/A conversion circuit 52 of the present exemplary embodiment may reduce the influence of the feedthrough noise to the circuit characteristic.

In addition, the CMOS switches 56A and 56B, included in the R-2R ladder resistor circuit 54, perform the opposite switching operations according to the bit signal in the semiconductor device 50. Accordingly, the feedthrough noises, generated in the CMOS switches 56A and 56B having the opposite-polarity relationship, cancel each other. Thus, the ladder resistor type D/A conversion circuit 52 of the present exemplary embodiment may reduce the influence of the feedthrough noise to the inverting input terminal 20B.

In addition, the R-2R ladder resistor circuit 54 is provided with the dummy CMOS switch 58 which performs the switching operation oppositely to the CMOS switch 56A in the semiconductor device 50. Accordingly, the feedthrough noise of the CMOS switch 56A is canceled by the feedthrough noise of the dummy CMOS switch 58. Thus, the semiconductor device 50 of the present exemplary embodiment may reduce the influence of the feedthrough noise to the analog signal.

Further, the R-2R ladder resistor circuit 54 includes the dummy CMOS switch 60 which performs the switching operation oppositely to the CMOS switch 569 in the semiconductor device 50. Accordingly, the feedthrough noise of the CMOS switch 56B is canceled by the feedthrough noise of the dummy CMOS switch 60. Thus, the semiconductor device 50 of the present exemplary embodiment may reduce the influence of the feedthrough noise to the reference potential $V_{REF}$.

What is claimed is:

1. An R-2R ladder resistor circuit, comprising:
   a plurality of first resistance elements, one end of each being connected to an input terminal;
   a plurality of second resistance elements, one end of each being connected to a reference potential;
   a plurality of third resistance elements, one end of each being connected to an output terminal;
   a plurality of switching connection sections that are each in correspondence relationships with the plurality of first resistance elements, the plurality of second resistance elements, and the plurality of third resistance elements, and that connect the input terminal and the output terminal according to a bit signal, wherein, according to the bit signal, each switching connection section switchably connects another end of a third resistance element to another end of a first resistance element or to another end of a second resistance element, among the first resistance element, the second resistance element, and the third resistance element corresponding thereto,
   wherein the switching connection sections each comprise a pair of CMOS switches that switch, according to the bit signal, between a first connection state in which the another end of the first resistance element and the another end of the third resistance element are connected without connecting the another end of the second resistance element and the another end of the third resistance element, and a second connection state in which the another end of the second resistance element and the another end of the third resistance element are connected without connecting the another end of the first resistance element and the another end of the third resistance element, and
   wherein one CMOS switch of the pair of CMOS switches is inserted between the first resistance element and the third resistance element, another CMOS switch of the pair of CMOS switches is inserted between the second resistance element and the third resistance element, and the one CMOS switch and the another CMOS switch perform opposite switching operations according to the bit signal; and a first CMOS switch, inserted between the one CMOS switch and the first resistance element, that includes a source and a drain that are short-circuited such that the one CMOS switch and the first resistance element are connected, and that performs a switching operation opposite to the one CMOS switch in the first connection state.

2. The R-2R ladder resistor circuit according to claim 1, wherein the first resistance element and the third resistance element, connected via the switching connection section, correspond to a 2R portion of the R-2R ladder resistor circuit, and the second resistance element and the third resistance element, connected via the switching connection section, correspond to the 2R portion.

3. The R-2R ladder resistor circuit according to claim 1, further comprising a second CMOS switch, inserted between the another CMOS switch and the second resistance element, that includes a source and a drain that are short-circuited such that the another CMOS switch and the second resistance element are connected, and that performs a switching operation opposite to the another CMOS switch in the second connection state.

4. A ladder resistor type D/A conversion circuit, comprising:
the R-2R ladder resistor circuit according to claim 1; and
an operational amplifier to which the output terminal included in the R-2R ladder resistor circuit is connected.

5. A semiconductor device, comprising:
the ladder resistor type D/A conversion circuit according to claim 4; and
a reference potential generation circuit that generates the reference potential and includes a supply terminal that supplies the generated reference potential to a plurality of circuits, including the ladder resistor type D/A conversion circuit, that require the reference potential.

6. An R-2R ladder resistor circuit, comprising:
a plurality of first resistance elements, one end of each being connected to an input terminal;
a plurality of second resistance elements, one end of each being connected to a reference potential that is different from a ground potential;
a plurality of third resistance elements, one end of each being connected to an output terminal;
a plurality of switching connection sections that are each in correspondence relationships with the plurality of first resistance elements, the plurality of second resistance elements, and the plurality of third resistance elements, wherein, according to a bit signal, each switching connection section switchably connects another end of a third resistance element to another end of a first resistance element or to another end of a second resistance element, among the first resistance element, the second resistance element, and the third resistance element corresponding thereto,
wherein the switching connection sections each comprise a pair of CMOS switches that switch, according to the bit signal, between a first connection state in which the another end of the first resistance element and the another end of the third resistance element are connected without connecting the another end of the second resistance element and the another end of the third resistance element, and a second connection state in which the another end of the second resistance element and the another end of the third resistance element are connected without connecting the another end of the first resistance element and the another end of the third resistance element, wherein one CMOS switch of the pair of CMOS switches is inserted between the first resistance element and the third resistance element, another CMOS switch of the pair of CMOS switches is inserted between the second resistance element and the third resistance element, and the one CMOS switch and the another CMOS switch perform opposite switching operations according to the bit signal; and a first CMOS switch, inserted between the one CMOS switch and the first resistance element, that includes a source and a drain that are short-circuited such that the one CMOS switch and the first resistance element are connected, and that performs a switching operation opposite to the one CMOS switch in the first connection state.

7. The R-2R ladder resistor circuit according to claim 6, further comprising a reference potential generation circuit that generates the reference potential and includes a supply terminal that supplies the generated reference potential to a plurality of circuits that require the reference potential, wherein the one end of each of the plurality of second resistance elements is connected to the supply terminal of the reference potential generation circuit.

8. The R-2R ladder resistor circuit according to claim 6, wherein the first resistance element and the third resistance element, connected via the switching connection section, correspond to a 2R portion of the R-2R ladder resistor circuit, and the second resistance element and the third resistance element, connected via the switching connection portion, correspond to the 2R portion.

9. The R-2R ladder resistor circuit according to claim 6, further comprising a second CMOS switch, inserted between the another CMOS switch and the second resistance element, that includes a source and a drain that are short-circuited such that the another CMOS switch and the second resistance element are connected, and that performs a switching operation opposite to the another CMOS switch in the second connection state.

10. A ladder resistor type D/A conversion circuit, comprising:
the R-2R ladder resistor circuit according to claim 6; and
an operational amplifier to which the output terminal included in the R-2R ladder resistor circuit is connected.

11. A semiconductor device, comprising:
the ladder resistor type D/A conversion circuit according to claim 10; and
a reference potential generation circuit that generates the reference potential and includes a supply terminal that supplies the generated reference potential to a plurality of circuits, including the ladder resistor type D/A conversion circuit, that require the reference potential.

12. An R-2R ladder resistor circuit, comprising:
a plurality of first resistance elements, one end of each being connected to an input terminal;
a plurality of second resistance elements, one end of each being connected to a reference potential;
a plurality of third resistance elements, one end of each being connected to an output terminal;
a plurality of switching connection sections, wherein each switching connection section from among the plurality of switch connection sections switchably connects another end of a corresponding third resistance element to another end of a corresponding first resistance element or to another end of a corresponding second resistance element, according a bit signal, wherein each connection path connecting the input terminal and the output terminal includes a first resistance element and a third resistance element, and each connection path connecting the reference potential and the output terminal includes a second resistance element and a third resistance element, wherein the switching connection sections each comprise a pair of CMOS switches that switch, according to the bit signal, between a first connection state in which the another end of the first resistance element and the another end of the third resistance element are connected without connecting the another end of the second resistance element and the another end of the third resistance element, and a second connection state in which the another end of the second resistance element and the another end of the third resistance element are connected without connecting the another end of the first resistance element and the another end of the third resistance element, and wherein one CMOS switch of the pair of CMOS switches is inserted between the first resistance element and the third resistance element, another CMOS switch of the pair of CMOS switches is inserted between the second resistance element and the third resistance element, and the one CMOS switch and the another CMOS switch perform opposite switching operations according to the bit signal; and a first CMOS switch, inserted between the one CMOS switch and the first resistance element, that includes a source and a drain that are short-circuited such that the one CMOS switch and the first resistance element are connected, and that performs a switching operation opposite to the one CMOS switch in the first connection state.

13. An R-2R ladder resistor circuit, comprising:
a plurality of first resistance elements, one end of each being connected to an input terminal;
a plurality of second resistance elements, one end of each being connected to a reference potential different from a ground potential;
a plurality of third resistance elements, one end of each being connected to an output terminal;
a plurality of switching connection sections, wherein each switching connection section from among the plurality of switching connection sections switchably connects another end of a corresponding third resistance element to another end of a corresponding first resistance element or to another end of a corresponding second resistance element, according a bit signal, wherein the switching connection sections each comprise a pair of CMOS switches that switch, according to the bit signal, between a first connection state in which the another end of the first resistance element and the another end of the third resistance element are connected without connecting the another end of the second resistance element and the another end of the third resistance element, and a second connection state in which the another end of the second resistance element and the another end of the third resistance element are connected without connecting the another end of the first resistance element and the another end of the third resistance element, wherein one CMOS switch of the pair of CMOS switches is inserted between the first resistance element and the third resistance element, another CMOS switch of the pair of CMOS switches is inserted between the second resistance element and the third resistance element, and the one CMOS switch and the another CMOS switch perform opposite switching operations according to the bit signal; and a first CMOS switch, inserted between the one CMOS switch and the first resistance element, that includes a source and a drain that are short-circuited such that the one CMOS switch and the first resistance element are connected, and that performs a switching operation opposite to the one CMOS switch in the first connection state.

* * * * *